United States Patent
Liu et al.

(10) Patent No.: US 11,527,739 B2
(45) Date of Patent: Dec. 13, 2022

(54) DISPLAY SUBSTRATE AND METHOD FOR FORMING DISPLAY SUBSTRATE, AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Yangsheng Liu, Beijing (CN); Xuwu Hu, Beijing (CN); Wei Lin, Beijing (CN); Hwang Kim, Beijing (CN)

(73) Assignees: Chengdu BOE Optoelectronics Technology Co., LTD., Sichuan (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 0 days.

(21) Appl. No.: 17/435,364

(22) PCT Filed: Jan. 12, 2021

(86) PCT No.: PCT/CN2021/071194
§ 371 (c)(1),
(2) Date: Aug. 31, 2021

(87) PCT Pub. No.: WO2021/147700
PCT Pub. Date: Jul. 29, 2021

(65) Prior Publication Data
US 2022/0149325 A1    May 12, 2022

(30) Foreign Application Priority Data

Jan. 22, 2020   (CN) .......................... 202010074039.3

(51) Int. Cl.
*H01L 51/52*        (2006.01)
*G06F 3/041*        (2006.01)
(Continued)

(52) U.S. Cl.
CPC ........ *H01L 51/5253* (2013.01); *G06F 3/0412* (2013.01); *G06F 3/0445* (2019.05);
(Continued)

(58) Field of Classification Search
CPC ... H01L 51/5253; H01L 27/323; H01L 51/56; G06F 3/0445; G06F 3/04164;
(Continued)

(56) References Cited

U.S. PATENT DOCUMENTS

2016/0307971 A1   10/2016  Jeon
2018/0046301 A1*   2/2018  Zhou ..................... G06F 3/0445
(Continued)

FOREIGN PATENT DOCUMENTS

CN        106057853 A       10/2016
CN        106873839 A        6/2017
(Continued)

OTHER PUBLICATIONS

PCT/CN2021/071194 international search report and written opinion.

*Primary Examiner* — Deeprose Subedi
(74) *Attorney, Agent, or Firm* — IPro, PLLC (57) ABSTRACT

A display substrate, a method for forming a display substrate, and a display device are provided. The display substrate includes a base substrate, a display area, a peripheral area surrounding the display area, a touch electrode, a touch electrode line, and a first barrier structure and a second barrier structure arranged in the peripheral area, the first barrier structure is arranged around the display area, and the second barrier structure is arranged around the first barrier structure and is spaced apart from the first barrier structure, and the touch electrode line extends from the display area to the peripheral area at a side of the second barrier structure away from the display area, a minimum value of a vertical
(Continued)

distance from the touch electrode line arranged between the first barrier structure and the second barrier structure to the base substrate is greater than a minimum value of a vertical distance from a surface, close to the base substrate, of the first barrier structure and the second barrier structure to the base substrate.

14 Claims, 6 Drawing Sheets

(51) Int. Cl.
*G06F 3/044* (2006.01)
*H01L 27/32* (2006.01)
*H01L 51/56* (2006.01)

(52) U.S. Cl.
CPC ........ *G06F 3/04164* (2019.05); *H01L 27/323* (2013.01); *H01L 51/56* (2013.01); *G06F 2203/04103* (2013.01); *G06F 2203/04111* (2013.01)

(58) Field of Classification Search
CPC ......... G06F 3/0412; G06F 2203/04103; G06F 2203/04111
See application file for complete search history.

(56) References Cited

U.S. PATENT DOCUMENTS

| | | | |
|---|---|---|---|
| 2018/0059862 | A1 | 3/2018 | Zeng et al. |
| 2018/0233541 | A1 | 8/2018 | Zeng et al. |

FOREIGN PATENT DOCUMENTS

| | | |
|---|---|---|
| CN | 106951125 A | 7/2017 |
| CN | 107785402 A | 3/2018 |
| CN | 111338499 A | 6/2020 |

* cited by examiner

DISPLAY SUBSTRATE AND METHOD FOR FORMING DISPLAY SUBSTRATE, AND DISPLAY DEVICE

CROSS-REFERENCE TO RELATED APPLICATIONS

This application is the U.S. national phase of PCT Application PCT/CN2021/071194 filed on Jan. 12, 2021, which claims priority to Chinese Patent Application No. 202010074039.3 filed in China on Jan. 22, 2020, the entire contents of which are incorporated herein by reference.

TECHNICAL FIELD

The present disclosure relates to the field of display technology, and in particular, to a display substrate, a method for forming a display substrate, and a display device.

BACKGROUND

The light-emitting unit of an OLED (Organic Light Emitting Diode) display device usually includes a first inorganic layer, an organic light-emitting layer, and a second inorganic layer arranged in a stacked manner. Due to the poor water/oxygen resistance of the organic light-emitting layer, water/oxygen may invade along the interface of the film layer and cause damage to the organic light-emitting layer.

SUMMARY

The embodiments of the present disclosure provide a display substrate, a method for forming a display substrate, and a display device, so as to solve the problem that the barrier structure may affect the reliability of the wiring.

In order to solve the above technical problems, the present disclosure is implemented as follows:

In a first aspect, a display substrate is provided in an embodiment of the present disclosure, including a base substrate, a display area, a peripheral area surrounding the display area, a touch electrode, a touch electrode line, and a first barrier structure and a second barrier structure arranged in the peripheral area, the first barrier structure is arranged around the display area, and the second barrier structure is arranged around the first barrier structure and is spaced apart from the first barrier structure;

the touch electrode line includes a first portion at a side of the first barrier structure and the second barrier structure away from the base substrate and a second portion between the first barrier structure and the second barrier structure, and the touch electrode line extends from the display area to the peripheral area at a side of the second barrier structure away from the display area;

a minimum value of a vertical distance from a surface, close to the base substrate, of the second portion of the touch electrode line arranged between the first barrier structure and the second barrier structure to the base substrate is greater than a vertical distance from a surface, close to the base substrate, of the first barrier structure to the base substrate; and/or a minimum value of a vertical distance from a surface, close to the base substrate, of the second portion of the touch electrode line arranged between the first barrier structure and the second barrier structure to the base substrate is greater than a vertical distance from a surface, close to the base substrate, of the second barrier structure to the base substrate.

Optionally, the display substrate further includes a connecting bridge, where the connecting bridge is arranged between the first barrier structure and the second barrier structure, and an orthographic projection of the second portion of the touch electrode line arranged between the first barrier structure and the second barrier structure onto the base substrate is within an orthographic projection of the connecting bridge onto the base substrate.

Optionally, the connecting bridge and a portion of the first barrier structure are arranged at a same layer and made of a same material, and the connecting bridge and a portion of the second barrier structure are arranged at a same layer and made of a same material.

Optionally, the display substrate further includes a planarization layer, where a portion of the planarization layer forms the connecting bridge.

Optionally, the display substrate further includes a planarization layer, where the first barrier structure and the second barrier structure respectively includes at least a portion of the planarization layer.

Optionally, the connecting bridge and the planarization layer are arranged at a same layer and made of a same material, and the second portion of the touch electrode line is arranged on a surface of the connecting bridge away from the base substrate.

Optionally, a vertical height difference from the first portion of the touch electrode line on the surface of the first barrier structure away from the base substrate to the second portion of the touch electrode line relative to the base substrate is less than a thickness of the first barrier structure in a direction perpendicular to the base substrate; and/or a vertical height difference from the first portion of the touch electrode line on the surface of the second barrier structure away from the base substrate to the second portion of the touch electrode line relative to the base substrate is less than a thickness of the second barrier structure in a direction perpendicular to the base substrate.

Optionally, the first barrier structure further includes a pixel defining layer, and a vertical height difference from the first portion of the touch electrode line on a surface of the pixel defining layer away from the base substrate to the second portion of the touch electrode line is equal to a thickness of the pixel defining layer in a direction perpendicular to the base substrate.

Optionally, the second barrier structure further includes a pixel defining layer and a spacer structure arranged at a side of the pixel defining layer away from the base substrate, a vertical height difference from the first portion of the touch electrode line on a surface of the spacer structure away from the base substrate to the second portion of the touch electrode line relative to the base substrate is equal to a sum of thicknesses of the pixel defining layer and the spacer structure in a direction perpendicular to the base substrate.

Optionally, the first barrier structure includes a first portion of the planarization layer, the second barrier structure includes a second portion of the planarization layer, and the connecting bridge is formed by a third portion of the planarization layer, and the first portion and the second portion of the planarization layer are connected by the third portion of the planarization layer.

Optionally, there exist a plurality of connecting bridges, and a hollow area is formed between two adjacent connecting bridges.

Optionally, in a direction from the first barrier structure to the second barrier structure, a cross section of the hollow area in a direction parallel to the base substrate includes a plurality of circular areas arranged in sequence.

Optionally, the touch electrode includes a first electrode layer and/or a second electrode layer, the touch electrode is arranged in the display area, and the touch electrode line is electrically connected to the first electrode layer and/or the second electrode layer.

In a second aspect, a display device including the display substrate hereinabove is further provided in an embodiment of the present disclosure.

In a third aspect, a method for forming a display substrate is further provided in an embodiment of the present disclosure, including:

forming a base substrate;

forming a first barrier structure and a second barrier structure in a peripheral area of the base substrate, where the first barrier structure is arranged around a display area of the display substrate, and the second barrier structure surrounds the first barrier structure and spaced apart from the first barrier structure;

forming a touch electrode and a touch electrode line at a side of the first barrier structure and the second barrier structure away from the base substrate, where the touch electrode includes a first electrode layer and/or a second electrode layer, the touch electrode is arranged in the display area, the touch electrode line is electrically connected to the first electrode layer and/or the second electrode layer, and the touch electrode line extends from the display area to the peripheral area at a side of the second barrier structure away from the display area, a minimum value of a vertical distance from the touch electrode line arranged between the first barrier structure and the second barrier structure to the base substrate is less than a minimum value of a vertical distance from a surface of the first barrier structure and the second barrier structure close to the base substrate to the base substrate.

Optionally, prior to the forming the first barrier structure and the second barrier structure on the base substrate, the method further includes:

forming a planarization layer on the base substrate, and a portion of the planarization layer arranged between the regions corresponding to the first barrier structure and the second barrier structure forms a connecting bridge, and the connecting bridge extends from an area corresponding to the first barrier structure to an area corresponding to the second barrier structure.

BRIEF DESCRIPTION OF THE DRAWINGS

In order to explain the technical solutions of the embodiments of the present disclosure more clearly, the following will briefly introduce the accompanying drawings used in the description of the embodiments of the present disclosure. Obviously, the accompanying drawings in the following description are only some embodiments of the present disclosure. For those of ordinary skill in the art, without creative labor, other drawings can be obtained based on these drawings.

DETAILED DESCRIPTION

The technical solutions in the embodiments of the present disclosure will be clearly and completely described below in conjunction with the accompanying drawings in the embodiments of the present disclosure. Obviously, the described embodiments are a portion of the embodiments of the present disclosure, but not all of the embodiments.

Based on the embodiments in the present disclosure, all other embodiments obtained by those of ordinary skill in the art without creative work shall fall within the protection scope of the present disclosure.

The OLED display panel in the related art generally improves the water/oxygen barrier through the convex barrier structure (dam) surrounding the display area, which can significantly improve the water/oxygen barrier effect.

However, some wirings of the display panel need to cross these barrier structures. For example, for a display panel with an on-cell touch integrated with a pixel unit, the wirings of the touch sensor need to cross the barrier structure. In order to ensure the water/oxygen barrier effect, the barrier structure needs to have a certain height, so when the wiring crosses these barrier structures, its extension direction needs to be continuously changed, and the climbing height is large, which is prone to short circuit, open circuit and other problems. Therefore, these barrier structures may affect the reliability of the wiring.

The embodiment of the present disclosure provides a display substrate.

In an embodiment of the present disclosure, the display substrate includes a base substrate 110 and a light-emitting layer on the base substrate 110, which may also include some other functional film layers. For details, please refer to the display substrate in the related art. Further limitation and description is repeated herein.

Figure 1A:
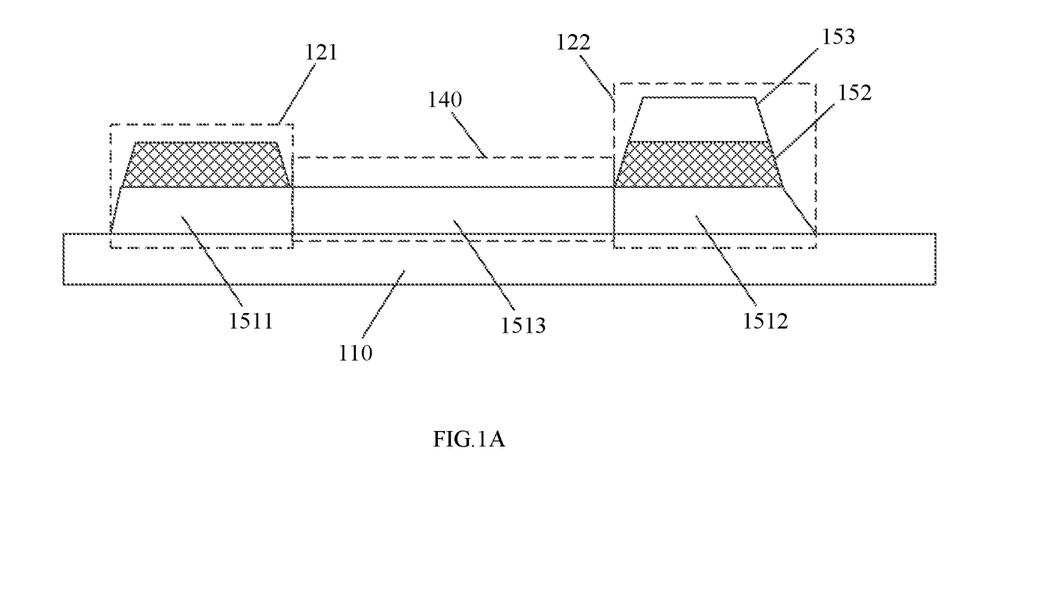
FIG. 1A is a schematic view of a barrier structure in a display substrate in an embodiment of the present disclosure.
Figure 1B:
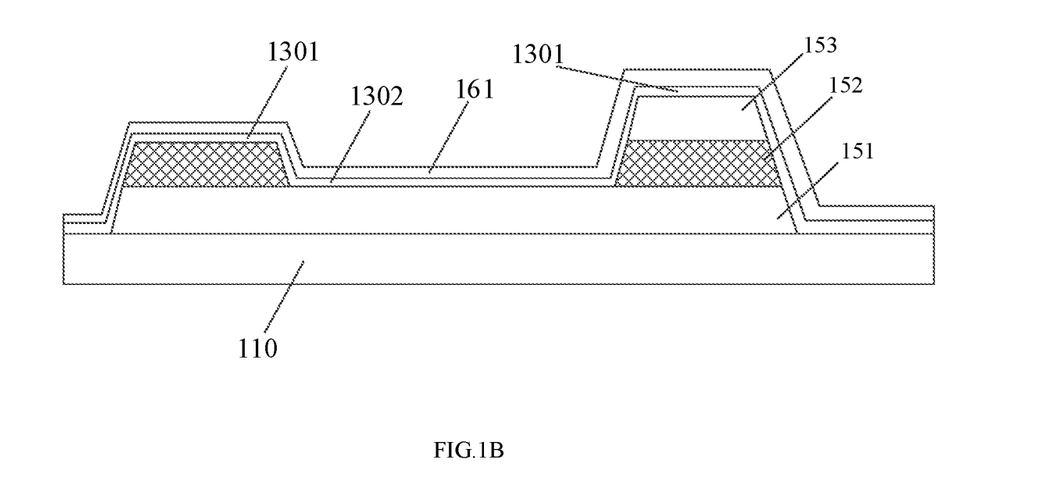
FIG. 1B is a schematic view of a display substrate in an embodiment of the present disclosure.

As shown in FIGS. 1A and 1B, the display substrate includes a display area (AA area) and a peripheral area surrounding the display area. The display substrate also includes a barrier structure (dam) and touch electrode lines 130 on the base substrate 110, the barrier structure specifically includes a first barrier structure 121 and a second barrier structure 122, and both of the first barrier structure 121 and the second barrier structure 122 are arranged in the peripheral area of the display substrate.

It should be noted that the base substrate 110 in the drawings of the present disclosure actually refers to the display substrate that has completed the front-end process of the backplane (BP), that is, it includes the base substrate 110 and other materials that need to be manufactured before the barrier structure is made. The film layer, for example, may include a plurality of organic layers, inorganic layers, etc., and may also include driving circuit structures such as thin film transistors (TFTs). For ease of observation, these structures are not shown in the drawings.

Figure 2:
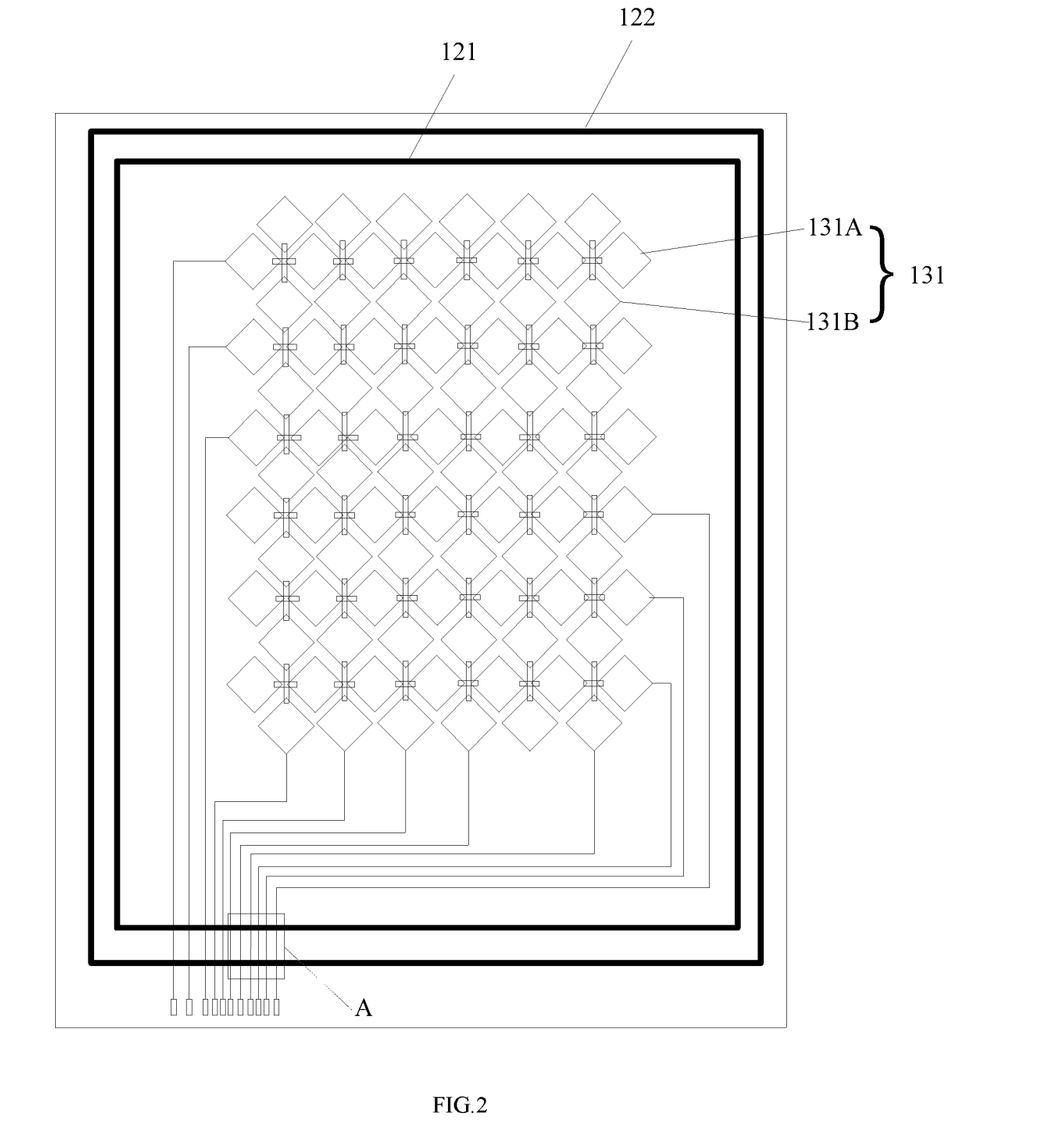
FIG. 2 is another schematic view of a display substrate in an embodiment of the present disclosure.

As shown in FIG. 2, the first barrier structure 121 is arranged around the display area of the display substrate, the second barrier structure 122 is arranged around the first barrier structure 121 and is spaced apart from the first barrier structure 121, a light-emitting unit is formed at the side the first barrier structure 121 and the second barrier structure 122 away from the base substrate 110. The first barrier structure 121 and the second barrier structure 122 are used to reduce the possibility of water/oxygen intruding into the organic light-emitting material of the light-emitting unit.

As shown in FIG. 1B, touch electrode lines 130 and touch electrodes 131 are also formed on the side of the first barrier structure 121 and the second barrier structure 122 away from the base substrate 110, where the touch electrode 131 includes a first electrode layer 131A and/or a second electrode layer 131B, and there are a plurality of groups of the touch electrode lines 130, and they are electrically connected to the first electrode layer 131A and/or the second electrode layer 131B, respectively, to transmit touch signals.

As shown in FIG. 1B, the touch electrode line 130 includes a first portion 1301 at a side of the first barrier structure 121 and the second barrier structure 122 away from the base substrate and a second portion 1302 between the first barrier structure and the second barrier structure.

The touch electrode line 130 extends from the display area of the display substrate to the peripheral area on the side of the second barrier structure 122 away from the display area. It can also be understood that the touch electrode line 130 needs to cross the first barrier structure 121 and second barrier structure 122.

Optionally, the display substrate further includes a touch sensor, and the touch electrode line 130 is electrically connected to the touch electrode 131 and the touch sensor to realize the transmission of touch signals.

A minimum value of a vertical distance from a surface, close to the base substrate, of the second portion 1302 of the touch electrode line 130 arranged between the first barrier structure 121 and the second barrier structure 122 to the base substrate is greater than a vertical distance from a surface, close to the base substrate 110, of the first barrier structure 121 to the base substrate 110 and a vertical distance from a surface, close to the base substrate 110, of the second barrier structure 122 to the base substrate 110.

In some embodiments, a minimum value of a vertical distance from a surface, close to the base substrate, of the second portion 1302 of the touch electrode line 130 arranged between the first barrier structure 121 and the second barrier structure 122 to the base substrate 110 is greater than a vertical distance from a surface, close to the base substrate 110, of the first barrier structure 121 to the base substrate 110.

In some embodiments, a minimum value of a vertical distance from a surface, close to the base substrate 110, of the second portion 1302 of the touch electrode line 130 arranged between the first barrier structure 121 and the second barrier structure 122 to the base substrate 110 is greater than a vertical distance from a surface, close to the base substrate 110, of the second barrier structure 122 to the base substrate 110.

It can also be understood that the distance from the touch electrode line 130 arranged between the first barrier structure 121 and the second barrier structure 122 to the base substrate 110 is greater than the distance from the bottom of the first barrier structure 121 to the base substrate 110, and is greater than the distance from the bottom of the second barrier structure 122 to the base substrate 110.

Here, the bottom of the first barrier structure 121 and the bottom of the second barrier structure 122 respectively refer to the positions of the bottom of the first barrier structure 121 and the bottom of the second barrier structure 122 that are closest to the base substrate 110.

In this way, in the direction perpendicular to the base substrate 110, the height difference of the touch electrode lines 130 is smaller than the height of the first barrier structure 121 and smaller than the height of the second barrier structure 122.

It should be understood that, in this embodiment, the farthest point of the touch electrode line 130 with respect to the base substrate 110 is arranged directly above the first barrier structure 121 or the second barrier structure 122, so that the height difference of the touch electrode line 130 is actually the height difference between the portion of the touch electrode line 130 arranged on the barrier structure and the portion thereof between the two barrier structures.

Since the vertical distance from the touch electrode line 130 to the base substrate 110 is greater than the vertical distance from the two barrier structures to the base substrate 110, the height difference of the touch electrode line 130 is smaller than the height of the barrier structure.

That is to say, the height change of the touch electrode line 130 relative to the base substrate 110 is smaller than the height of the first barrier structure 121 relative to the base substrate 110, and is smaller than the height of the second barrier structure 122 relative to the base substrate 110. Therefore, the climbing height of the touch electrode line 130 may be reduced.

When the extension length of the touch electrode line 130 in the direction parallel to the base substrate 110 is constant, its climbing height is reduced, so its height change rate is also reduced, or its climbing rate is reduced, thereby improving the strength and reliability of the structure.

According to the embodiment of the present disclosure, by controlling the height difference of the touch electrode line 130 to be smaller than the height of the first barrier structure 121 and smaller than the height of the second barrier structure 122, that is, the climbing height of the touch electrode line 130 is reduced during the wiring process, thereby improving the reliability of the wiring.

Figure 3A:
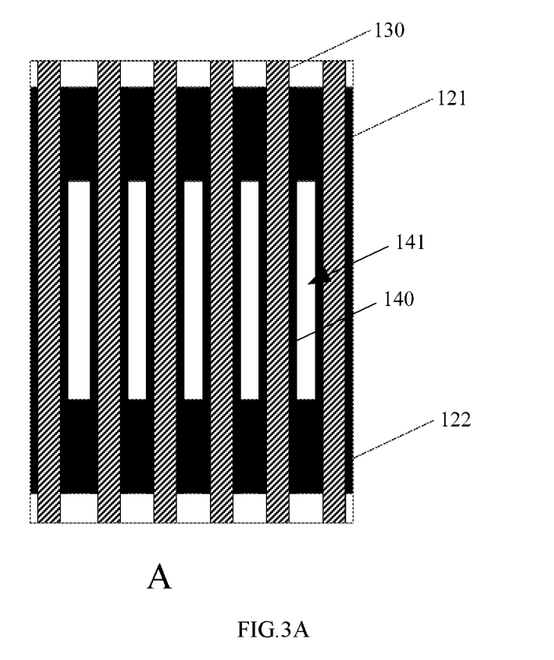
FIG. 3A is a schematic view of a local structure at A in FIG. 2.
Figure 3B:
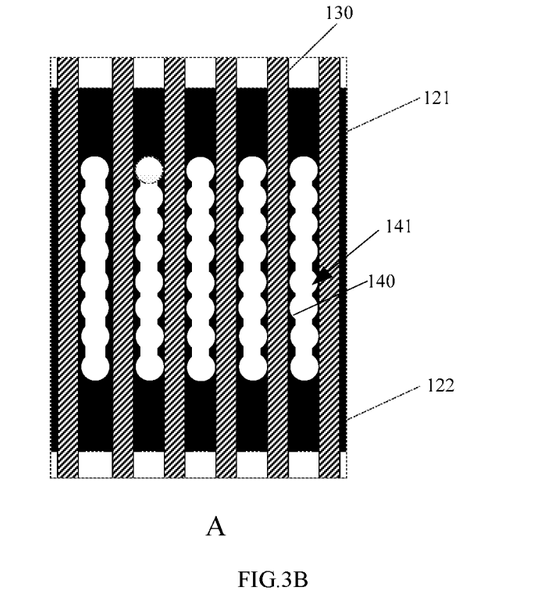
FIG. 3B is another schematic view of the local structure at A in FIG. 2.

Optionally, as shown in FIG. 1A, FIG. 3A and FIG. 3B, the climbing height of the touch electrode line 130 is reduced by the connecting bridge 140.

Specifically, the connecting bridge 140 is arranged between the first barrier structure 121 and the second barrier structure 122, and both ends of the connecting bridge 140 extend to the first barrier structure 121 and the second barrier structure 122, respectively, and the touch electrode line 130 is arranged at the second barrier structure. The orthographic projection of the second portion between the barrier structure 121 and the second barrier structure 122 on the base substrate 110 is within the range of the orthographic projection of the connecting bridge 140 on the base substrate 110.

As shown in FIGS. 1A and 1B, the first barrier structure includes a first portion 1511 of the planarization layer, the second barrier structure includes a second portion 1512 of the planarization layer, and the connecting bridge is formed by the planarization layer. The third part 1513 of the planarization layer is formed by connecting the first portion 1511 and the second portion 1512 of the planarization layer.

It should be understood that the wiring position of the touch electrode lines 130 is arranged on the side of each barrier structure away from the base substrate 110, so it can be considered that the height difference of the touch electrode lines 130 is approximately equal to the height of each barrier structure.

When a connecting bridge 140 is provided between the first barrier structure 121 and the second barrier structure 122, and the orthographic projection of the touch electrode line 130 on the base substrate 110 is in the range of the orthographic projection of the connecting bridge 140 on the base substrate 110. It can be understood that the wiring position of the touch electrode line 130 is exactly on the connecting bridge 140.

In this way, the distance from the portion of the touch electrode line 130 arranged between the first barrier structure 121 and the second barrier structure 122 to the base substrate 110 increases, and the increased size can be approximately regarded as equal to the thickness of the connection bridge 140 in the direction perpendicular to the base substrate 110. In other words, the height difference of the touch electrode lines 130 is reduced, and the reduced amount is approximately equal to the thickness of the connecting bridge 140.

In this way, by providing the connecting bridge 140, and the orthographic projection of the touch electrode line 130 on the base substrate 110 is within the range of the orthographic projection of the connecting bridge 140 on the base substrate 110, the minimum distance between the base substrates 110 and the touch electrode line 130 can be improved, and the height difference of the touch electrode line 130 may be reduced under the condition that other structures remain unchanged, thereby reducing the climbing height and the climbing rate of the touch electrode lines 130, improving the reliability of the wiring of the touch electrode line 130.

Optionally, as shown in FIGS. 1A and 1B, the connecting bridge 140 and a portion of the first barrier structure 121 are arranged in the same layer and made of the same material, and the connecting bridge 140 and a portion of the second barrier structure 121 are arranged in the same layer and made of the same material.

It should be understood that the barrier structure can be formed separately; the barrier structure can also be formed together with other structures to reduce the number of processes.

For example, in the process of forming the planarization layer (PLN) 151, the pixel defining layer (PDL) 152, and the spacer structure (PS) 153, the corresponding ring-shaped areas are respectively reserved, so that the reserved ring-shaped areas are stacked to form a barrier structure, that is, the partial materials of one or more of the planarization layer 151, the pixel defining layer 152, and the spacer structure 153 form at least a portion of the first barrier structure 121 and/or at least a portion of the second barrier structure.

Optionally, when making the corresponding film layer, not only the two circular areas corresponding to the two barrier structures are reserved, but also a portion of the material arranged between the two circular areas is reserved, and this portion of the material forms the connecting bridge 140.

According to the embodiment of the present disclosure, there is no need to add additional processes, and only need to adjust the structure of the mask when making the corresponding film layer, so as to adjust the exposure area, so that the material of the part corresponding to the connecting bridge 140 is preserved. The connecting bridge 140 is formed.

That is to say, according to the embodiment of the present disclosure, it is not necessary to adjust the process, but only to adjust the structure of the mask to complete the fabrication of the connecting bridge 140. The process is relatively mature and stable, and it also helps controlling costs.

Optionally, the display substrate includes a planarization layer 151, and a portion of the planarization layer 151 forms a connecting bridge 140.

Portion of the material of the planarization layer 151 may be or not be a portion of the barrier structure. During implementation, the material in the region corresponding to the planarization layer 151 and the connecting bridge 140 is reserved. In this way, after the production of the planarization layer 151 is completed, the remaining material forms the connecting bridge 140.

Take portion of the material of the planarization layer 151 to form a barrier structure as an example for illustration.

Figure 4A:
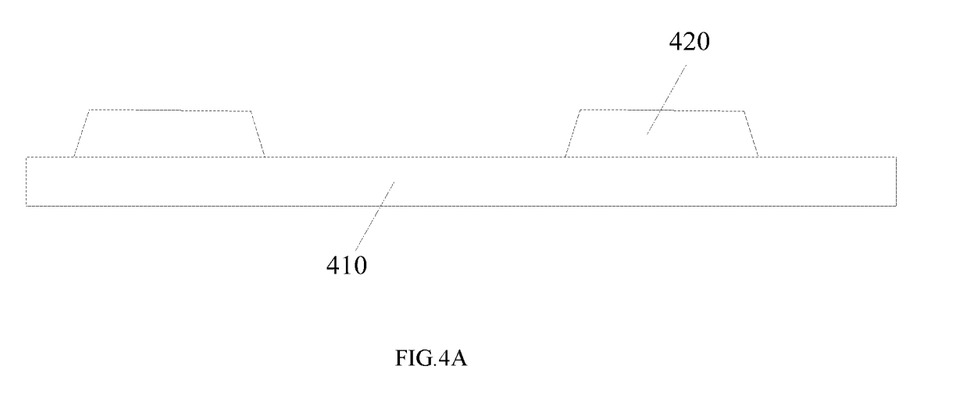
FIG. 4A is a schematic view of a structure of a display substrate in the related art.

As shown in FIG. 4A, in the related art, during the process of fabricating the planarization layer 420 on the base substrate 410, only the region corresponding to the barrier structure is reserved.

As shown in FIG. 1A, in the technical solution of this embodiment, when the planarization layer 151 is formed, portion of the material between the first barrier structure 121 and the second barrier structure 122 is still retained, so that portion of the retained material forms the connection bridge 140.

Subsequent reference is made to related technologies to fabricate other film layers, and other parts of the barrier structure are formed during the fabrication process. For example, portion of the material of the pixel defining layer 152 is reserved to form a component of the barrier structure, and portion of the material of the spacer structure 153 is retained to form a component of the barrier structure.

Figure 4B:
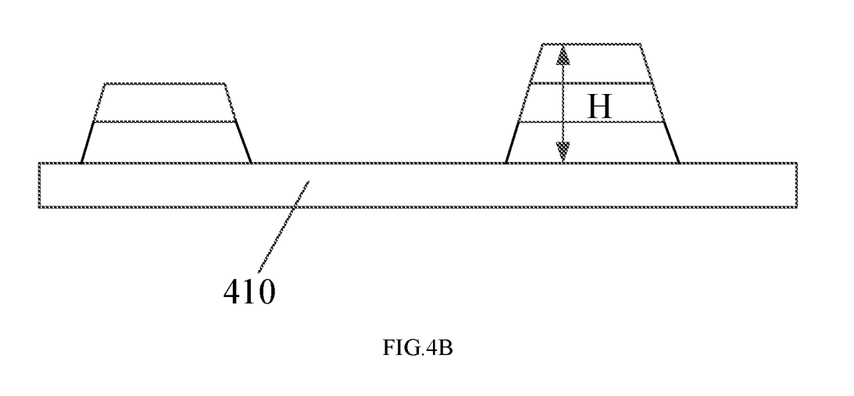
FIG. 4B is another schematic view of a structure of the display substrate in the related art.

As shown in FIG. 4B, in the related art, after the barrier structure is completed, the wiring height difference of the touch electrode line 130 is about the height H of the barrier structure, which is relatively large, and in this embodiment, the height difference of the wirings is smaller than H, specifically, it is about the height of the barrier structure minus the height of the connecting bridge.

Optionally, as shown in FIGS. 3A and 3B, there exist a plurality of connecting bridges 140, and a hollow area 141 is formed between two adjacent connecting bridges 140.

It should be understood that if the height of the region between the first barrier structure 121 and the second barrier structure 122 (that is, the distance from the base substrate 110) is equal to the height of the first barrier structure 121 or the second barrier structure 122 If the difference is small, the water/oxygen insulation effect may be reduced. Therefore, in this embodiment, the material in the area between two adjacent connecting bridges 140 is removed to form a hollow area 141.

As shown in FIG. 3A, the shape of the hollow area 141 may be rectangular, as shown in FIG. 3B. Obviously, the shape of the hollow area 141 is not limited to this. A cross section of the hollow area in a direction parallel to the base substrate 110 includes a plurality of circular areas arranged in sequence. In this way, by increasing the complexity of the shape of the hollow area 141, thereby improving the water/oxygen insulation effect.

Obviously, the display substrate may also include some other structures, such as structures such as the inorganic layer 161 arranged on the side of the touch electrode away from the base substrate 110. For details, please refer to related technologies, which will not be repeated here.

The structure of the display substrate in one embodiment of the present disclosure will be described in detail below with reference to FIG. 1B of the description.

As shown in FIG. 1B, the connecting bridge 140 and the planarization layer 151 are arranged in the same layer and made of the same material. At this time, the connecting bridge 140 is a portion of the planarization layer 151. The second portion 1302 of the touch electrode line is arranged on a surface of the connecting bridge 140 away from the base substrate 110.

As shown in FIG. 1B, a vertical height difference from the first portion 1301 of the touch electrode line on the surface of the first barrier structure 121 away from the base substrate 110 to the second portion 1302 of the touch electrode line relative to the base substrate 110 is less than a thickness of the first barrier structure 121 in a direction perpendicular to the base substrate 110; and/or as shown in FIG. 1B, a vertical height difference from the first portion 1301 of the touch electrode line on the surface of the second barrier structure 122 away from the base substrate 110 to the second portion 1302 of the touch electrode line relative to the base substrate 110 is less than a thickness of the second barrier structure 122 in a direction perpendicular to the base substrate 110.

As shown in FIG. 1B, the first barrier structure 121 further includes a pixel defining layer 152, and a vertical height difference from the first portion 1301 of the touch electrode line on a surface of the pixel defining layer away from the base substrate 110 to the second portion 1302 of the touch electrode line is equal to a thickness of the pixel defining layer 152 in a direction perpendicular to the base substrate 110.

As shown in FIG. 1B, the second barrier structure 122 further includes a pixel defining layer 152 and a spacer structure 153 arranged at a side of the pixel defining layer 152 away from the base substrate, a vertical height difference from the first portion 1301 of the touch electrode line on a surface of the spacer structure 153 away from the base substrate 110 to the second portion 1302 of the touch electrode line relative to the base substrate 110 is equal to a sum of thicknesses of the pixel defining layer 152 and the spacer structure 153 in a direction perpendicular to the base substrate 110. The embodiment of the present disclosure also provides a display device, which includes any of the above display substrates. Since the technical solution of this embodiment includes all the technical solutions of the above-mentioned display substrate embodiment, it can at least achieve all the above-mentioned technical effects, which will not be repeated here.

The present disclosure also provides a method for forming the display substrate.

Figure 5:
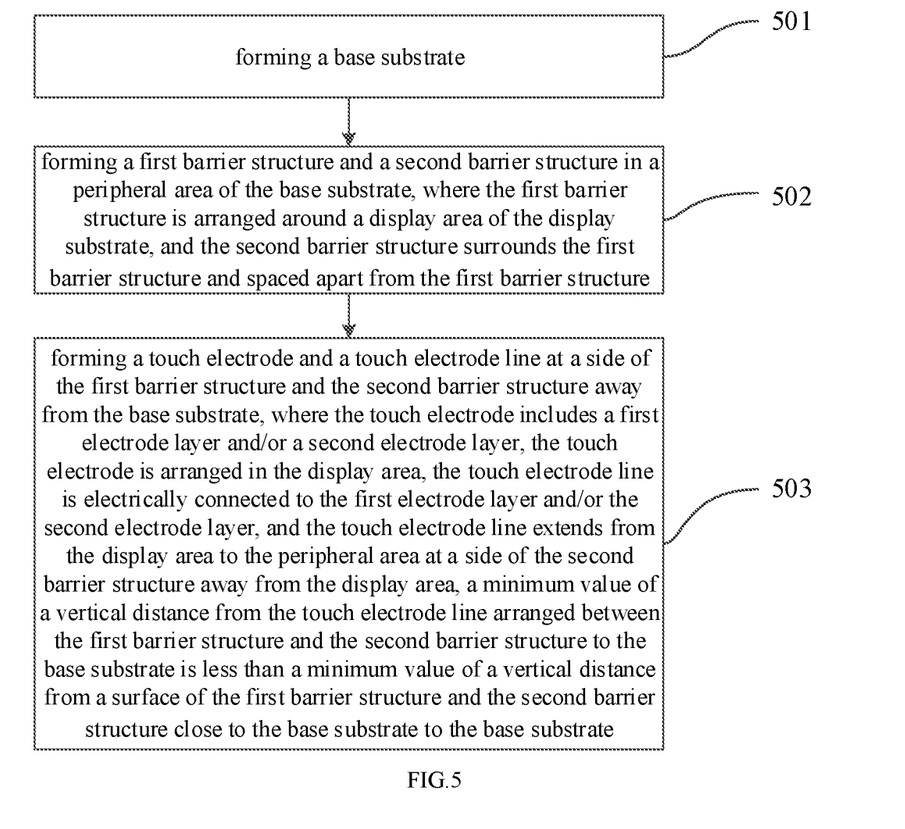
FIG. 5 is a flowchart of a method for forming a display substrate in an embodiment of the present disclosure.

As shown in FIG. 5, in one embodiment, the method for forming the display substrate includes the following steps:

Step 501: forming a base substrate.

Step 502: forming a first barrier structure and a second barrier structure in a peripheral area of the base substrate, where the first barrier structure is arranged around a display area of the display substrate, and the second barrier structure surrounds the first barrier structure and spaced apart from the first barrier structure;

Step 503: forming a touch electrode and a touch electrode line at a side of the first barrier structure and the second barrier structure away from the base substrate, where the touch electrode includes a first electrode layer and/or a second electrode layer, the touch electrode is arranged in the display area, the touch electrode line is electrically connected to the first electrode layer and/or the second electrode layer, and the touch electrode line extends from the display area to the peripheral area at a side of the second barrier structure away from the display area, a minimum value of a vertical distance from the touch electrode line arranged between the first barrier structure and the second barrier structure to the base substrate is less than a minimum value of a vertical distance from a surface of the first barrier structure and the second barrier structure close to the base substrate to the base substrate.

The technical solution of this embodiment can manufacture the display substrate in the above-mentioned display substrate embodiment, and can achieve basically the same technical effect, which will not be repeated here.

Optionally, prior to the forming the first barrier structure and the second barrier structure on the base substrate, the method further include:

forming a planarization layer on the base substrate, and a portion of the planarization layer arranged between the regions corresponding to the first barrier structure and the second barrier structure forms a connecting bridge, and the connecting bridge extends from an area corresponding to the first barrier structure to an area corresponding to the second barrier structure.

In this embodiment, during the process of forming the planarization layer, a part of the material of the planarization layer is retained to form a part of the barrier structure, where the barrier structure specifically includes a first barrier structure and a second barrier structure.

At the same time, portion of the material of the planarization layer is retained to form the connecting bridge. In this way, during the manufacturing process, only the exposed area of the mask used in the process of manufacturing the planarization layer needs to be adjusted to realize the retention of portion of the planarization layer material to form the barrier structure.

That is to say, the technical solution of this embodiment does not require major adjustments to the production process, and the process is relatively mature and stable, which is beneficial to cost control.

Optionally, the forming the touch electrode and the touch electrode line at a side of the first barrier structure and the second barrier structure away from the base substrate includes:

forming the touch electrode line, where the orthographic projection of the touch electrode line on the base substrate is within the orthographic projection of the connecting bridge on the base substrate.

In this embodiment, the process of making touch electrode lines can refer to the related technology. The main difference from the related technology is that the structure of the mask used in this embodiment has been adjusted, and the adjusted part is mainly arranged in an area corresponding area between the first barrier structure and the second barrier structure.

By controlling its exposure area, in the area between the first barrier structure and the second barrier structure, the wiring range of the touch electrode line corresponds to the position of the connecting bridge. It can also be understood that, in this area, the orthographic projection of the touch electrode line on the base substrate is within the orthographic projection of the connecting bridge on the base substrate.

In this way, the method for forming a display panel can manufacture the display substrate in the above-mentioned display substrate embodiment, and can achieve basically the same technical effect, which will not be repeated here.

In addition, compared with related art, the technical solution of this embodiment does not adjust the process steps, sequence, etc., but mainly needs to adjust the mask used in the production of the planarization layer and the production of the touch electrode line, the process is relatively mature, there is less content to be adjusted, and no additional cost will be added.

Figure 6:
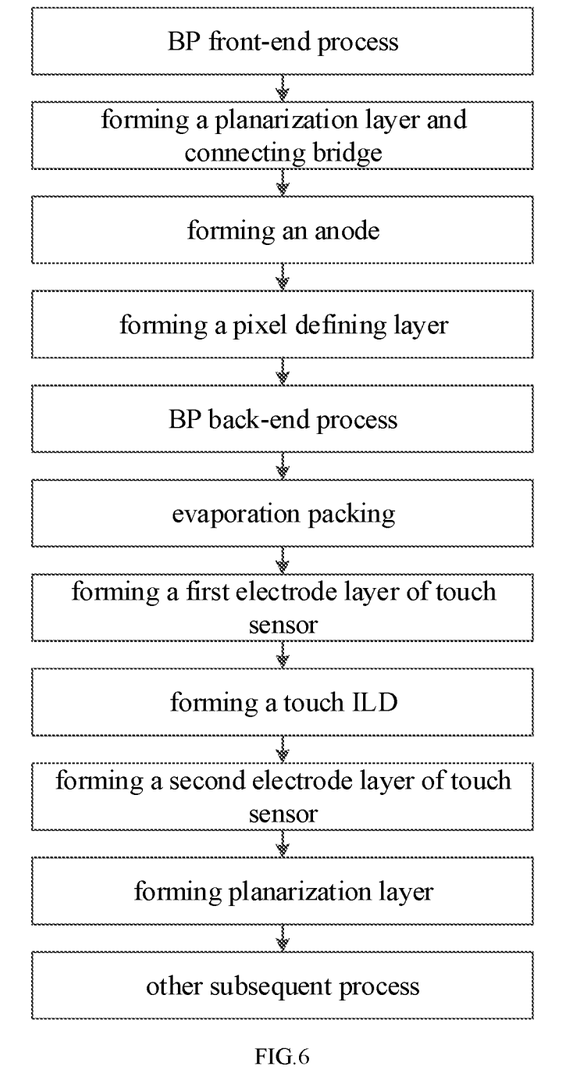
FIG. 6 is another flowchart of a method for forming a display substrate in an embodiment of the present disclosure.

As shown in FIG. 6, the technical solution of this embodiment can be summarized as follows: first, the backplane front-end process (BP front-end process) is completed on the base substrate. Here, the BP front-end process may include the fabrication of thin film transistors and other structures as required, which may be refer to related technologies, and will not be repeated here.

Then, the production of the planarization layer is carried out. The process of making the planarization layer can refer to the related technology. The main difference from the related technology is that the mask used is slightly different, so that a portion of the planarization layer material can be retained to form a connection bridge.

Next, the anode and the pixel defining layer are further completed, and the BP back-end process is further completed. Obviously, these steps can also be implemented with reference to related technologies.

Then, the vapor deposition package is performed. After the vapor deposition package, the touch sensor is manufactured. The manufacturing process of the touch sensor mainly includes forming the first electrode layer, the touch dielectric layer (touch ILD), and the second electrode layer in sequence. The electrode layer and the touch planarization layer are made at the same time as the touch electrode lines and the corresponding electrode layers that are electrically connected to the first electrode layer and the second electrode layer. The main difference in the related technology is that when the first electrode layer and the second electrode layer are made, the mask used is slightly adjusted so that in the area between the first barrier structure and the second barrier structure, the routing position of the touch electrode line is on the connecting bridge.

After the manufacture of the touch sensor is completed, other subsequent processes are further completed.

It can be seen that, in the technical solution of this embodiment, the sequence of the steps is not adjusted, nor is the step added or reduced. The mask used in the production of the planarization layer and the touch sensor is mainly adjusted, thereby the wiring positions for forming the connecting bridges and controlling the touch electrode lines correspond to the positions of the connecting bridges. Therefore, compared with the related art, the method for forming the display substrate of this embodiment does not require much adjustment, and the process is relatively mature. It will not increase other additional costs, which is helpful for promotion and realization.

The above are only some embodiments of the present disclosure, but the protection scope of the present disclosure is not limited thereto. Any person skilled in the art can easily think of changes or substitutions within the technical scope disclosed in the present disclosure. It should be covered within the protection scope of the present disclosure. Therefore, the protection scope of the present disclosure should be subject to the protection scope of the claims.

What is claimed is:

1. A display substrate, comprising a base substrate, a display area, a peripheral area surrounding the display area, a touch electrode, a touch electrode line, and a first barrier structure and a second barrier structure arranged in the peripheral area, the first barrier structure is arranged around the display area, and the second barrier structure is arranged around the first barrier structure and is spaced apart from the first barrier structure;

the touch electrode line comprises a first portion at a side of the first barrier structure and the second barrier structure away from the base substrate and a second portion between the first barrier structure and the second barrier structure, and the touch electrode line extends from the display area to the peripheral area at a side of the second barrier structure away from the display area;

a minimum value of a vertical distance from a surface, close to the base substrate, of the second portion of the touch electrode line arranged between the first barrier structure and the second barrier structure to the base substrate is greater than a vertical distance from a surface, close to the base substrate, of the first barrier structure to the base substrate; and/or a minimum value of a vertical distance from a surface, close to the base substrate, of the second portion of the touch electrode line arranged between the first barrier structure and the second barrier structure to the base substrate is greater than a vertical distance from a surface, close to the base substrate, of the second barrier structure to the base substrate;

wherein the display substrate further comprises a connecting bridge, wherein the connecting bridge is arranged between the first barrier structure and the second barrier structure, and an orthographic projection of the second portion of the touch electrode line arranged between the first barrier structure and the second barrier structure onto the base substrate is within an orthographic projection of the connecting bridge onto the base substrate;

wherein the connecting bridge and a portion of the first barrier structure are arranged at a same layer and made of a same material, and the connecting bridge and a portion of the second barrier structure are arranged at a same layer and made of a same material.

2. The display substrate according to claim 1, further comprising a planarization layer, wherein a portion of the planarization layer forms the connecting bridge.

3. The display substrate according to claim 1, further comprising a planarization layer, wherein the first barrier structure and the second barrier structure respectively comprises at least a portion of the planarization layer.

4. The display substrate according to claim 3, wherein the connecting bridge and the planarization layer are arranged at a same layer and made of a same material, and the second portion of the touch electrode line is arranged on a surface of the connecting bridge away from the base substrate.

5. The display substrate according to claim 4, wherein a vertical height difference from the first portion of the touch electrode line on the surface of the first barrier structure away from the base substrate to the second portion of the touch electrode line relative to the base substrate is less than a thickness of the first barrier structure in a direction perpendicular to the base substrate; and/or a vertical height difference from the first portion of the touch electrode line on the surface of the second barrier structure away from the base substrate to the second portion of the touch electrode line relative to the base substrate is less than a thickness of the second barrier structure in a direction perpendicular to the base substrate.

6. The display substrate according to claim 4, wherein the first barrier structure further comprises a pixel defining layer, and a vertical height difference from the first portion of the touch electrode line on a surface of the pixel defining layer away from the base substrate to the second portion of the touch electrode line is equal to a thickness of the pixel defining layer in a direction perpendicular to the base substrate.

7. The display substrate according to claim 4, wherein the second barrier structure further comprises a pixel defining layer and a spacer structure arranged at a side of the pixel defining layer away from the base substrate,
a vertical height difference from the first portion of the touch electrode line on a surface of the spacer structure away from the base substrate to the second portion of the touch electrode line relative to the base substrate is equal to a sum of thicknesses of the pixel defining layer and the spacer structure in a direction perpendicular to the base substrate.

8. The display substrate according to claim 4, wherein the first barrier structure comprises a first portion of the planarization layer, the second barrier structure comprises a second portion of the planarization layer, and the connecting bridge is formed by a third portion of the planarization layer, and the first portion and the second portion of the planarization layer are connected by the third portion of the planarization layer.

9. The display substrate according to claim 1, wherein there exist a plurality of connecting bridges, and a hollow area is formed between two adjacent connecting bridges.

10. The display substrate according to claim 9, wherein, in a direction from the first barrier structure to the second barrier structure, a cross section of the hollow area in a direction parallel to the base substrate comprises a plurality of circular areas arranged in sequence.

11. The display substrate according to claim 1, wherein the touch electrode comprises a first electrode layer and/or a second electrode layer, the touch electrode is arranged in the display area, and the touch electrode line is electrically connected to the first electrode layer and/or the second electrode layer.

12. A display device comprising a display substrate;
wherein the display substrate comprises a base substrate, a display area, a peripheral area surrounding the display area, a touch electrode, a touch electrode line, and a first barrier structure and a second barrier structure arranged in the peripheral area, the first barrier structure is arranged around the display area, and the second barrier structure is arranged around the first barrier structure and is spaced apart from the first barrier structure;
the touch electrode line comprises a first portion at a side of the first barrier structure and the second barrier structure away from the base substrate and a second portion between the first barrier structure and the second barrier structure, and the touch electrode line extends from the display area to the peripheral area at a side of the second barrier structure away from the display area;
a minimum value of a vertical distance from a surface, close to the base substrate, of the second portion of the touch electrode line arranged between the first barrier structure and the second barrier structure to the base substrate is greater than a vertical distance from a surface, close to the base substrate, of the first barrier structure to the base substrate; and/or
a minimum value of a vertical distance from a surface, close to the base substrate, of the second portion of the touch electrode line arranged between the first barrier structure and the second barrier structure to the base substrate is greater than a vertical distance from a surface, close to the base substrate, of the second barrier structure to the base substrate;
wherein the display substrate further comprises a connecting bridge, wherein the connecting bridge is arranged between the first barrier structure and the second barrier structure, and an orthographic projection of the second portion of the touch electrode line arranged between the first barrier structure and the second barrier structure onto the base substrate is within an orthographic projection of the connecting bridge onto the base substrate;
wherein there exist a plurality of connecting bridges, and a hollow area is formed between two adjacent connecting bridges.

13. A method for forming a display substrate, comprising:
forming a base substrate;
forming a first barrier structure and a second barrier structure in a peripheral area of the base substrate, wherein the first barrier structure is arranged around a display area of the display substrate, and the second barrier structure surrounds the first barrier structure and spaced apart from the first barrier structure;
forming a touch electrode and a touch electrode line at a side of the first barrier structure and the second barrier structure away from the base substrate, wherein the touch electrode comprises a first electrode layer and/or a second electrode layer, the touch electrode is arranged in the display area, the touch electrode line is electrically connected to the first electrode layer and/or the second electrode layer, and the touch electrode line extends from the display area to the peripheral area at a side of the second barrier structure away from the display area, a minimum value of a vertical distance from the touch electrode line arranged between the first barrier structure and the second barrier structure to the base substrate is less than a minimum value of a vertical distance from a surface of the first barrier structure and the second barrier structure close to the base substrate to the base substrate;
the display substrate comprises the base substrate, the display area, the peripheral area surrounding the display area, the touch electrode, the touch electrode line, and the first barrier structure and the second barrier structure arranged in the peripheral area, the first barrier structure is arranged around the display area, and the second barrier structure is arranged around the first barrier structure and is spaced apart from the first barrier structure;
the touch electrode line comprises a first portion at a side of the first barrier structure and the second barrier structure away from the base substrate and a second portion between the first barrier structure and the second barrier structure, and the touch electrode line extends from the display area to the peripheral area at a side of the second barrier structure away from the display area;
a minimum value of a vertical distance from a surface, close to the base substrate, of the second portion of the touch electrode line arranged between the first barrier structure and the second barrier structure to the base substrate is greater than a vertical distance from a surface, close to the base substrate, of the first barrier structure to the base substrate; and/or a minimum value of a vertical distance from a surface, close to the base substrate, of the second portion of the touch electrode line arranged between the first barrier structure and the second barrier structure to the base substrate is greater than a vertical distance from a surface, close to the base substrate, of the second barrier structure to the base substrate;

wherein the display substrate further comprises a connecting bridge, wherein the connecting bridge is arranged between the first barrier structure and the second barrier structure, and an orthographic projection of the second portion of the touch electrode line arranged between the first barrier structure and the second barrier structure onto the base substrate is within an orthographic projection of the connecting bridge onto the base substrate;

wherein the display substrate further comprises a planarization layer, wherein a portion of the planarization layer forms the connecting bridge;
or the display substrate further comprises a planarization layer, wherein the first barrier structure and the second barrier structure respectively comprises at least a portion of the planarization layer.

14. The method according to claim 13, wherein prior to the forming the first barrier structure and the second barrier structure on the base substrate, the method further comprises:

forming the planarization layer on the base substrate, and a portion of the planarization layer arranged between the regions corresponding to the first barrier structure and the second barrier structure forms the connecting bridge, and the connecting bridge extends from an area corresponding to the first barrier structure to an area corresponding to the second barrier structure.

* * * * *